United States Patent [19]
Briguglio et al.

[11] Patent Number: 5,458,921
[45] Date of Patent: Oct. 17, 1995

[54] SOLVENT SYSTEM FOR FORMING FILMS OF PHOTOIMAGEABLE COMPOSITIONS

[75] Inventors: James J. Briguglio, Balboa, Calif.; Kirk Johnson, Austin; Harold D. Sullivan, Corsicana, both of Tex.

[73] Assignee: Morton International, Inc., Chicago, Ill.

[21] Appl. No.: 321,341

[22] Filed: Oct. 11, 1994

[51] Int. Cl.⁶ .................................................. B05D 3/02
[52] U.S. Cl. ........................ 427/385.5; 427/420; 430/281; 430/311; 430/330
[58] Field of Search .................... 427/420, 385.5; 430/271, 280, 281, 288, 311, 325, 327, 330, 916, 927; 522/101, 104, 170

[56] References Cited

U.S. PATENT DOCUMENTS 5,229,252  7/1993  Flynn et al. ............................ 430/280
5,364,736  11/1994  Eramo et al. ............................ 430/280

*Primary Examiner*—Michael Lusignan
*Attorney, Agent, or Firm*—Wayne E. Nacker; Gerald K. White

[57] ABSTRACT

To apply a photoimageable composition to a substrate, such as a printed circuit board, the photoimageable composition is dissolved in a solvent system which is a mixture of propylene glycol monomethylether and ethylene glycol butylether, acetate. The liquid solution is applied to the substrate. Then the photoimageable composition is dried to remove the solvent system and thereby produce a layer of the photoimageable composition on the substrate.

8 Claims, No Drawings

SOLVENT SYSTEM FOR FORMING FILMS OF PHOTOIMAGEABLE COMPOSITIONS

The present invention is directed to formation of films or layers of photoimageable compositions, such as primary photoresists or solder mask-forming resists, using a particularly advantageous solvent system.

BACKGROUND OF THE INVENTION

The production of printed circuit boards typically employs one or more steps wherein a photoimageable composition is utilized. Primary photoresists are used to form the initial circuitry pattern by processes such as etching or additive plating. Once the circuitry traces are formed, a printed circuit board is typically covered with a solder mask that is formed from a photoimageable composition which is hardenable so as to form a permanent layer covering circuitry on a printed circuit board.

Photoimageable compositions known in the art may be positive-acting or negative-acting. Positive-acting resists comprise a polymeric resin and a sensitizer. Upon exposure to actinic radiation the sensitizer effects degradation of the polymeric resin in the exposed areas. The degraded polymeric resin is then washed away by developer. Negative-acting resists comprise a film-forming binder, a photopolymerizable material (which may or may not include chemical moieties of the binder), and a photoinitiator or photoinitiator chemical system. Upon exposure to actinic radiation, a photoinitiated polymerization of the photopolymerizable material is initiated, resulting in immobilization of the film-forming binder and thereby causing the exposed portions to be insoluble in developer, such as a solvent developer or an aqueous based developer.

Examples of various types of photoimageable compositions are found in U.S. Pat. Nos. 3,953,309, 4,064,287, 2,670,287, 3,376,139, 3,402,044 and 5,229,252, the teachings of each of which are incorporated herein by reference.

For forming films or layers of photoimageable compositions on a substrate, such as a primary resist layer on a circuit board blank, a solder mask-forming layer on a printed board, or as a layer on a support sheet for forming a dry film, it is most common to dissolve the components of the photoimageable composition in a solvent or solvents, apply the photoimageable composition to the substrate as a liquid, and then allow the solvent to evaporate to form the film or layer. A variety of processes of applying the liquid composition are available, such as spraying, dip coating, roller coating, or curtain coating. The choice of solvent or solvents affects not only the drying time of the applied photoimageable composition but the characteristics of the applied film. Rapid drying is generally desirable from an efficiency standpoint; however, if drying is too rapid, solvent bubbles may develop.

Rapid, uniform application of a photoimageable composition to a substrate may be done by curtain coating wherein a substrate, such as a printed circuit board, is conveyed through a falling curtain of photoimageable composition, e.g., a solder mask-forming resist. Such a process is taught in U.S. Pat. No. 4,230,793, the teachings of which are incorporated herein by reference. In a curtain coating operation, drying of the coated boards is effected by conveying the coated boards through a drying oven, e.g., at temperatures of between about 85° and about 240° C. The drying time of the photoimageable composition is particularly critical in such a continuous process.

The present invention is directed to a solvent system for photoimageable compositions which provides a particularly desirable dry time. The solvent system of the invention is suitable in all of the types of photoimageable compositions discussed above and suitable for all methods of application.

The solvent system of the present invention is particularly suitable for negative-acting photoimageable compositions and most particularly suitable for solder mask-forming photoimageable compositions containing an epoxy resin for post exposure/post development hardening. Such photoimageable compositions are found for example in above-referenced U.S. Pat. No. 5,229,252 and U.S. patent application Ser. No. 08/075,356 filed 10 Jun. 1993, now U.S. Pat. No. 5,364,736, the teachings of each of which are incorporated herein by reference.

The solvent system of the present invention is particularly advantageous for photoimageable compositions which are applied by curtain coating. Examples of commercial epoxy resin-containing, solder mask-forming, photoimageable compositions are Epic® CC-100 and Epic® CC-200 sold by Morton International, Morton Electronic Materials.

SUMMARY OF THE INVENTION

In accordance with the invention, a photoimageable composition which includes a film-forming binder is dissolved in a solvent system comprising between about 35 and about 65, preferably between about 40 and about 60 volume percent, propylene glycol methylether and between about 35 and about 65, preferably between about 40 and about 60 volume percent, ethylene glycol butylether, acetate. The solvent system is particularly suitable for use with an epoxy resin-containing, negative acting photoimageable composition and is particularly advantage for use in applying photoimageable compositions by curtain coating.

DETAILED DESCRIPTION OF CERTAIN PREFERRED EMBODIMENTS

Propylene glycol methylether is a fast drying solvent having a boiling point of 121° C. Surprisingly, it effects more rapid drying of photoimageable compositions than some solvents having lower boiling points. Propylene glycol methylether by itself, however, effects too rapid drying, particularly at temperatures above about 100° C., resulting in the formation of solvent bubbles and "pinholes" when the bubbles burst. Accordingly, it is necessary to add a slower drying solvent and it is found that ethylene glycol butylether, acetate is a slower drying solvent, boiling point range of 186°–194° C., which works particularly well with propylene glycol methylether to effect a rapid dry of the photoimageable composition. It is believed that propylene glycol methylether evaporates rapidly from the film while ethylene glycol butylether, acetate keeps the surface of the film open to facilitate this drying.

Propylene glycol methylether and ethylene glycol butylether acetate are used at about 35:65 to about 65:35 V/V rations, preferably at about 40:60 to about 60:40 V/V ratios. Best results were achieved through the use of propylene glycol methylether and ethylene glycol butylether acetate at a 50:50 V/V ratio.

The photoimageable composition is dissolved in the solvent system to between about 30 and about 70 wt % solids. "Solids" is intended herein to include all components which don't evaporate with the solvent. Lower solvent levels produce faster dry times. However, other considerations, such as a desired viscosity for application are also considered when adjusting the solids level. For curtain coating, a viscosity of between about 75 and about 2000 cps at the application temperature is desired.

While the solvent system is considered suitable for any type of film-forming photoimageable composition soluble in the solvent system, it is found particularly suitable for negative-acting, alkaline aqueous-developable photoresists. Photoresists of this type typically contain between A) between about 20 and about 80 wt. % of a flowable, film-forming polymeric binder which as an acid number of about 100 or greater and is soluble in alkaline aqueous solution, B) between about 20 and about 80 wt % of a polymerizable acrylic substance, and C) between about 1 and about 15 wt % of a photosensitive, free radical-generating initiator chemical system which in the presence of actinic radiation initiates polymerization of the acrylic substance B), these wt. percentages being based on total amount of A), B), and C).

A very particularly suitable use of the solvent system of the present invention is solder mask-forming compositions of the type described in above-referenced U.S. patent application Ser. No. 075,356. Such compositions comprise a) between about 10 and about 40 wt. percent of a flowable, film-forming polymeric binder which has an acid number of about 100 or greater and is soluble in alkaline aqueous solution;

b) between about 5 and about 25 wt. percent of a cross-linking agent for the polymeric binder which is reactive with complementary groups of the polymeric binder;

c) between about 15 and about 35 wt. percent of a polymerizable acrylic substance;

d) between about 0.01 and about 15 wt. percent of a photosensitive, free radical-generating initiator chemical system which in the presence of actinic radiation initiates polymerization of the acrylic substance c) to form a three-dimensional chemical structure that renders actinic radiation-exposed portions of the photoimageable composition insoluble to alkaline aqueous solutions;

e) between about 20 and about 50 wt. percent of an epoxy resin composition which is curable with heat to harden the photoimageable composition subsequent to exposure to actinic radiation; and f) 0 to 5 wt. %, preferably at least about 0.01 wt. percent, of a cure catalyst for the epoxy resin; the above-expressed weight percentages being based upon total weight of components a)–f) as being 100%.

One class of film-forming materials useful as binders a) in forming the solder mask-forming photoimageable compositions comprises polymers and copolymers of acrylic acids. These polymers and copolymers contain free carboxyl groups and are therefore soluble in alkaline aqueous solutions. These binders are selected for sufficient solubility in alkaline aqueous solution and are employed at a sufficient weight percent of the photoimageable composition that the photoimageable composition is likewise soluble in alkaline aqueous solutions (until exposure to actinic radiation) and hence developable in alkaline aqueous solution. Generally, the higher the acid number of the acrylic polymeric binder, the more soluble the photoimageable composition is in alkaline aqueous solution and the acrylic polymers and copolymers used in the preferred solder mask-forming compositions generally have acid numbers greater than about 100, preferably greater than about 150 and most preferably greater than about 200. To provide a high acid number, the polymeric binder material must be formed from one or more acrylic monomers having a free carboxylic acid group, e.g., acrylic acid and methacrylic acid.

The polymeric binder a) may be, and generally is, formed from additional comonomers, including esters of acrylic acids, such as methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxy-phenyl)-propane diacrylate, pentaerythritol tetracrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate.

Suitable non-acrylate co-monomers which may be incorporated in the binders include, but are not limited to, styrene, vinyl toluene, maleate esters such as dibutyl maleate, maleic anhydride, vinyl ethers, vinyl ketones, vinyl pyridines and allyl acetoacetates.

Another type of material used as binders in photoimageable compositions in accordance with the present invention are styrene-maleic anhydride copolymers in which the monomer units derived from maleic anhydride remain in the anhydride state. The polymers, while having no free hydroxyl or carboxylic acid groups, may be saponified in alkaline solution to the acid form. Styrene-maleic anhydride copolymers, which are saponifiable to acid numbers of about 100 or more, are preferred, as they provide good solubility in aqueous solution.

The cross-linking agent b) acts primarily at temperatures somewhat above room temperature, e.g., above 35° C., whereby the photoimageable composition may be applied to a substrate at or near room temperature and subsequently "heat-bumped", prior to exposure and development, to effect a controlled level of cross-linking. It is important for several applications that the controlled level of cross-linking be effected using relatively mild temperatures and in a relatively short period of time. By relatively mild temperatures and relatively short periods of time, is herein meant, in comparison to the substantially higher temperatures and/or longer periods of time required to finally cure the epoxy resins subsequent to exposure and development.

Preferred cross-linking agents b) are melamine-formaldehyde condensation products, such as those sold under the trademark Resimene by Monsanto, St. Louis, MO or Cymel by American Cyanamid. The functional groups on the amino moieties react with complementary reactive groups, e.g., hydroxyl groups, on the resin, forming a three-dimensional thermoset polymer network. Other suitable cross-linking agents include urea-formaldehyde resins and phenolic resins.

The photoimaging system is based upon the polymerizable acrylic substances (c). The polymerizable acrylic substances are generally monomers containing one or more acrylic moieties. They can, however, contain acrylic dimers or trimers. Any of the acrylic monomers listed above as components of an acrylic polymeric binder is suitable as a polymerizable acrylic substance for purpose of this invention. Mixtures of acrylates are also suitable. As in polyacrylate binder, the polymerizable acrylate substance(s) must be selected with the intended shelf-life of the photoimageable composition in mind, and levels of free carboxyl, hydroxyl, amide and other epoxy-reactive functional groups appropriately controlled.

In some cases, it has been found to be advantageous to use an acrylic monomer that includes at least one free hydroxyl group, for example, hydroxy alkyl acrylates and methacrylates, such as pentaerythritol tetraacrylate, 2-hydroxy ethyl acrylate, 2-hydroxy ethyl methacrylate and 2-ethoxy ethyl methacrylate.

Also required in conjunction with the polymerizable acrylate substance is a chemical initiator system d) which generates free radicals in the presence of actinic radiation and polymerizes the acrylic substance. Polymerization of acrylic monomer units into a three-dimensional structure insolubilizes the photoimageable composition by immobilizing the polymeric binder. The choice of the photosensitive, free radical-generating initiator system is not considered to be critical to the practice of the present invention, and a wide variety of such compounds may be successfully utilized in the practice of this invention. Examples of chemical photoinitiator systems include benzophenone, benzoin ether, benzil ketals and acetophenone and its derivatives. Other suitable initiator systems are described, for example, in U.S. Pat. Nos. 3,469,982, 4,451,523 and 4,358,477, the teachings of which are incorporated herein by reference. The amount of photoinitiator employed may vary over a wide range, depending upon the polymerizable acrylic substance(s), the particular photoinitiator system and the desired time of development. Generally, the photoinitiator chemical system comprises between about 0.01 and about 15 wt. % of the homogeneous solution (a)–(f).

The material which imparts the excellent hardness and durability to the film or layer after development and final curing is the epoxy resin or mixture of epoxy resins e). The epoxy resin or resins comprise between about 20 and about 50 percent by weight of the homogeneous solution (a)–(f). At high temperatures and/or in the presence of a catalyst, the epoxy groups of the resin molecules open and react with other materials present. Primarily the epoxy resin molecules react with each other; however, to a certain extent, the epoxy molecules react during final curing with the cross-linking agent, and perhaps also with the acrylic binder material and the remaining polymerized and unpolymerized acrylate substances. The major consideration of selection of the epoxy resin or mixture of resins is that the epoxy resin composition be a liquid at about room temperature, whereupon the photoimageable composition can be applied as a liquid film to the substrate. Generally, lower molecular weight epoxies, e.g., having molecular weights between about 240 and about 260, tend to be liquid, and preferably at least about 70% by weight of the epoxy resins comprises polyepoxy molecules having molecular weights below 260. It is permissible, however, to dissolve higher molecular weight, solid epoxies in the lower molecular weight, liquid epoxies, providing that the combination of epoxy resins is liquid. Higher molecular weight epoxies may be advantageously incorporated into a photoimageable composition to control viscosity of the photoimageable composition. The inclusion of some higher molecular weight epoxy resin dissolved in lower molecular weight epoxy resin may result in formation of a harder, more durable film.

A wide variety of epoxy resins are suitable for use in accordance with the present invention. Suitable epoxy resins are described, for example, in U.S. Pat. No. 4,092,443, the teachings of which are incorporated herein by reference. Preferred epoxy resins for purpose of the invention are cycloaliphatic epoxides, such as those sold under the trade names Cyanacure UVR-6100 and UVR-6110 by Union Carbide, Danbury, Conn.

Epoxy resins are generally heat-curable; high temperatures open the epoxy groups, thereby causing them to react. Several applications of the preferred solder mask-forming photoimageable compositions require that curing of the epoxy resin composition takes place at a higher temperature and/or is cured over a longer period of time than the temperature and time required for the "heat-bump", during which the acrylic binder is cross-linked to a controlled extent. Although some degree of curing of the epoxy resins may take place continuously and even at a somewhat increased rate during the "heat-bump" the epoxy resin composition in several applications must remain substantially uncured until after exposure to patterned actinic radiation and development. Once the epoxy resin composition cures to any appreciable extent, the photoimageable composition becomes insoluble in aqueous and alkaline aqueous solutions and therefore non-developable. Accordingly, the epoxy resin composition is further selected so as to be curable under harsher conditions of time and temperature than are required for the initial heat-bump.

Although epoxy resins will auto-cure, particularly when heated, the photoimageable composition preferably includes a cure catalyst f) for the epoxy resin composition which promotes more rapid curing at the final heat cure temperature. Suitable heat-activated curing agents include polycarboxylic acid anhydrides, dicyandiamides, complexes of amines, such as tertiary amines, with boron trifluoride or boron trichloride, latent boron difluoride chelates, aromatic polyamines and imidazoles, such as 2-ethyl-4-methylimidazole. Other examples of epoxy cure catalysts are found in U.S. Pat. No. 4,438,189, the teachings of which are incorporated herein by reference. Preferred epoxy catalysts are blocked or latent catalysts, such as those sold under the trade name SA-102 by Air Products. Such catalysts have an epoxy-catalyzing group, e.g., an acid group or amine or amide group, appropriately blocked. At a threshold temperature, the catalyst releases its blocking group and catalyzes epoxy ring opening. The threshold activation temperature of such catalysts is particularly advantageous in a process which includes an initial, relatively low-temperature, relatively short-time heat-bump and a subsequent heat-cure under more vigorous temperature/time conditions. Epoxy cure catalysts are used at levels of from about 0.01 to about 5 wt. percent of the homogeneous solution (a)–(f).

The components of the photoimageable composition are selected to be mutually soluble to form a single-phase liquid composition. The liquid photoimageable composition is dissolved in the solvent mixture of the present invention to a desired solids level and may be applied to a substrate by a variety of application methods, including screen printing, curtain coating, roller coating and extrusion coating. Each application method has its own particularities, and photoimageable compositions in accordance with this invention may be formulated in accordance with the particular requirements of the particular method of application, e.g., provide a suitable solids level so as to obtain a suitable photoimageable composition viscosity. In addition to the components described above which are essential to a photoimageable composition in accordance with the invention, the photoimageable composition may optionally contain additional components which are standard in the art. The photoimageable composition may contain organic or inorganic fillers at levels up to about 35 wt. percent relative to components (a)–(f). Some examples of fillers are micro talc, ground polyethylene, clay, fumed silica and polyvinylidene fluoride. Also, relatively small amounts of flow-control agents, antioxidants, dyes, etc. may be added.

An important use of the compositions of this type is for direct application to a printed circuit board where contact printing is to be employed. The composition is applied as a layer on the surface of the printed board. Subsequent to application of the photoimageable composition to the surface, the photoimageable composition is "heat-bumped" for a controlled period of time so that the photoimageable composition forms a non-tacky layer, yet leaves the photoimageable composition soluble in an appropriate aqueous solution. The "heat-bump" takes place at a controlled temperature and for a controlled time period to achieve the non-tacky condition; however, care must be taken to avoid excess cross-linking of the several components which would render the photoimageable composition insoluble in aqueous or alkaline aqueous solutions. "Heat-bump" times and temperatures must be determined for each particular photoimageable composition. For any particular photoimageable composition, different temperatures may be used with different times. Typically, heat-bump temperatures range from about 70°–100° C. at times of from 5 to 60 min.; however, it can easily be appreciated that lower temperatures with longer "heat-bump" times may be employed.

During the "heat-bump", the primary reaction is between the cross-linking agent and the polymeric binder; however, minor reactions probably involve interactions between a number of components. "Heat-bump" reactions contribute to non-tackiness of the film. For applications where the film is to remain soluble and developable in an appropriate aqueous or alkaline aqueous solution, reactions which occur during the "heat-bump" must be consistent with continued solubility of the film.

For contact printing and dry film applications, the non-tacky, but developable film which forms after the "heat-bump" is ready for exposure to actinic radiation. For contact-printing, the artwork, e.g., diazo artwork, is laid directly on the film. The non-tacky nature of the film at this stage enables the artwork to be contacted with the film. As those with skill in the art readily appreciate, contact printing is generally preferred over remote exposure techniques for producing sharply defined images. Light intensities (which generally depends upon the unit used) and exposure times (which are generally determined by the operator) determine the light energy applied during exposure. Required light energies for exposure depends primarily on the polymerizable acrylic substances and the photoinitiator systems used and amounts thereof. Exposure must be determined for each photoimageable composition.

For non-contact printing, the film may be exposed either after a "heat-bump", which leaves the film soluble in aqueous or alkali aqueous solution, or with the film in unaltered, tacky form.

Subsequent to exposure, the non-exposed portions are dissolved and washed away in aqueous or alkaline aqueous solution. This type of photoimageable composition based upon binder-containing films having high acid numbers are developed in an alkaline aqueous solution. Typical alkaline developers contain from 0.5 to about 3% by weight of a weak base, such as potassium carbonate, sodium carbonate or ammonium hydroxide or from about 0.4% to about 3% by weight of a strong base, such as sodium hydroxide or potassium hydroxide.

Following development, it is preferred to again expose the film to actinic radiation to effect a UV-cure. The UV-cure is optional, but is helpful in producing a stronger permanent film. Primarily, the UV-cure is believed to polymerize or cross-link any remaining polymerizable acrylic substance.

The primary cure of the exposed and developed film is the thermal cure which opens the epoxy groups of the epoxy resin molecules, resulting in cross-linking of the epoxy resin molecules with each other and with the other materials in the film. The thermal cure is generally carried out at temperatures ranging from about 100° C. to about 200° C. for a period of from about 15 min. to about 2 hrs. A typical cure would be 150° C. for an hour. The actual cure time and cure temperature depends upon the epoxy resin used, the epoxy cure catalyst and the amounts of each. If a blocked or latent epoxy cure catalyst is used, curing is done at a temperature above that which polyvinylidene the catalyst.

The invention will now be described in greater detail by way of specific examples.

EXAMPLE 1

A solder mask-forming photoimageable composition is formulated as follows:

| Component | % Wt. |
| --- | --- |
| Acrylic resin (binder), acid no. 200 (monomer content 30 wt % acrylic acid, 70 wt % styrene) | 22.6 |
| 1,8 diaza-bicyclo-(5,4,0)-undecene-7-phenol salt | 1.2 |
| Equal wt. mixture of (a) hydroxyethyl methacrylate, (b) bisphenol A diacrylate, and (c) dipentaerithritol monohydroxy pentaacrylate | 21.8 |
| 2,2 dimethyl 2 phenyl-acetophenone | 3.0 |
| Liquid cycloalphatic monoepoxy, epoxy equiv. 120–130 | 42.4 |
| Methylated melamine | 9.0 |
| | 100.0 |
| plus | |
| Leveling agent | 1.2 |
| Pigment (phthalocyanine green CI#74260) | 1.2 |
| Fillers | |
| fumed silica | 1.8 |
| micro talc | 14.4 |
| ground polyethylene | 0.9 |

The above formulation is dissolved in the following solvent systems to a 70% solids level, solvent system A being in accordance with the present invention, solvent systems B–G being comparative examples:

A. 50:50 (by volume) ethylene glycol butylether acetate/ propylene glycol monomethyl ether B. 50:50 (by volume) ethylene glycol butyl ether acetate/ propylene glycol methyl ether acetate (PMA)

C. PMA

D. ethylene glycol butylether acetate

E. Ethyl 3-Ethoxypropionate (EEP)

F. 50:50 (by volume) EEP/n-butyl acetate

G. propylene glycol monomethyl ether.

The composition in each of the solvent systems was applied on a Ciba Geigy Probimer® curtain coating line including a curtain coater and drying apparatus. Application of the composition was at 25° C. to printed circuit boards moving at 121 m/min. Composition was supplied at a rate sufficient to provide a film (after drying) of 1.0 mils thick. Drying was at 145° C. for 2.0 minutes. Results as are per the table below:

| Solvent System | Film Condition, e.g., Defects |
|---|---|
| A. | Perfectly dried, no defects |
| B. | Surface marring, incomplete drying |
| C. | Surface marring, mask in the holes |
| D. | Fair drying, slight surface marring |
| E. | Incomplete drying, volcano's |
| F. | Incomplete drying, surface marring |
| G. | Incomplete drying, volcanos, surface marring |

EXAMPLE 2

To a primary, alkaline aqueous-developable photoresist, Laminar® HG sold by Morton international, was added 5 wt % of a 50:50 (by volume) mixture of propylene glycol methylether/ethylene glycol butylether acetate. The HG, as formulated is at 47% solids in methylethylketone (MEK), thus the altered composition contains, in addition to the solvent system of the present invention, contained the normal amounts of MEK. The altered HG composition and unaltered HG composition were each applied to a circuit board blank to a (dry) thickness of 1.0 mil. Each was dried for 120 sec. at 200° F. (93.3° C.). At this time, residual solvents were measured by gas chromatography. The altered sample showed 0.12 wt % residual solvent; the unaltered sample 0.26 wt % residual solvent.

What is claimed is:

1. In a method of applying a layer of photoimageable composition to a substrate comprising dissolving said photoimageable composition in organic solvent to a solids level of between about 30 and about 70 wt % to produce a photoimageable composition solution, applying said solution to a substrate, and drying said applied solution to remove said organic solvent and thereby produce a layer of said photoimageable composition, the improvement wherein said organic solvent is a mixture of between about 35 and about 65 volume percent propylene glycol monomethylether and between about 35 and about 65 volume percent ethylene glycol butylether acetate.

2. The method according to claim 1 wherein said organic solvent is a mixture of between about 40 and about 60 volume percent propylene glycol methylether and between about 40 and about 60 volume percent ethylene glycol butylether acetate.

3. The method according to claim 1 wherein said drying is effected at temperatures of between about 85° and about 240° C.

4. The method according to claim 1 wherein said solution is applied by curtain coating.

5. The method according to claim 1 wherein said photoimageable composition comprises:

a) between about 10 and about 40 wt. percent of a flowable, film-forming polymeric binder which has an acid number of about 100 or greater and is soluble in alkaline aqueous solution;

b) between about 5 and about 25 wt. percent of a cross-linking agent for the polymeric binder which is reactive with complementary groups of the polymeric binder;

c) between about 15 and about 35 wt. percent of a polymerizable acrylic substance;

d) between about 0.01 and about 15 wt. percent of a photosensitive, free radical-generating initiator chemical system which in the presence of actinic radiation initiates polymerization of the acrylic substance c) to form a three-dimensional chemical structure that renders actinic radiation-exposed portions of the photoimageable composition insoluble to alkaline aqueous solutions;

e) between about 20 and about 50 wt. percent of an epoxy resin composition which is curable with heat to harden the photoimageable composition subsequent to exposure to actinic radiation; and f) 0 to 5 wt. % of a cure catalyst for the epoxy resin; said weight percentages being based upon total weight of components a)–f) as being 100%.

6. A method in accordance with claim 5 wherein said photoimageable composition containing at least about 0.01 wt % of said cure catalyst f).

7. A method in accordance with claim 5 wherein said solution is applied by curtain coating.

8. A method in accordance with claim 1 wherein said photoimageable composition comprises between A) between about 20 and about 80 wt. % of a flowable, film-forming polymeric binder which as an acid number of about 100 or greater and is soluble in alkaline aqueous solution, B) between about 20 and about 80 wt % of a polymerizable acrylic substance, and C) between about 1 and about 15 wt % of a photosensitive, free radical-generating initiator chemical system which in the presence of actinic radiation initiates polymerization of the acrylic substance B); said wt. percentages being based on total amount of A), B), and C).

* * * * *